US012762317B2

(12) United States Patent
Duale et al.

(10) Patent No.: US 12,762,317 B2
(45) Date of Patent: Oct. 13, 2026

(54) SYSTEM LEVEL TESTING OF ARTIFICIAL INTELLIGENCE PRIMITIVES

(71) Applicant: International Business Machines Corporation, Armonk, NY (US)

(72) Inventors: Ali Y. Duale, Poughkeepsie, NY (US); Timothy Slegel, Staatsburg, NY (US); Patrick Duffy, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 316 days.

(21) Appl. No.: 18/059,664

(22) Filed: Nov. 29, 2022

(65) Prior Publication Data

US 2024/0176937 A1 May 30, 2024

(51) Int. Cl.
*G06F 30/331* (2020.01)
*G06F 15/78* (2006.01)

(52) U.S. Cl.
CPC ........ *G06F 30/331* (2020.01); *G06F 15/7871* (2013.01)

(58) Field of Classification Search
CPC ........................... G06F 30/331; G06F 15/7871
See application file for complete search history.

(56) References Cited

U.S. PATENT DOCUMENTS

| | | | | |
|---|---|---|---|---|
| 6,611,779 | B2 | 8/2003 | Kohno et al. | |
| 9,461,876 | B2 | 10/2016 | Van Dusen et al. | |
| 11,080,336 | B2 | 8/2021 | Van Dusen | |
| 12,111,740 | B2 | 10/2024 | Duale et al. | |
| 2005/0081170 | A1* | 4/2005 | Hyduke | G06F 30/331 703/19 |
| 2017/0177458 | A1 | 6/2017 | Viggers et al. | |
| 2019/0102180 | A1 | 4/2019 | Hari et al. | |
| 2020/0126664 | A1 | 4/2020 | Sato | |
| 2021/0240615 | A1 | 8/2021 | Sohn et al. | |
| 2022/0082616 | A1 | 3/2022 | Doshi et al. | |
| 2022/0206978 | A1* | 6/2022 | Kim | G06F 11/273 |
| 2023/0267569 | A1* | 8/2023 | Zhu | G06F 9/5066 345/501 |
| 2024/0135082 | A1* | 4/2024 | Chiranjeevi | G06F 30/398 |

(Continued)

OTHER PUBLICATIONS

Lichtenau et al., "AI Accelerator on IBM Telum Processor Industrial Product" ISCA '22, Jun. 18-22, 2022, pp. 1012-1028 [retrieved from https://dl.acm.org/doi/pdf/10.1145/3470496.3533042]. (Year: 2022).*

(Continued)

*Primary Examiner* — Brian W Wathen
(74) *Attorney, Agent, or Firm* — Kristofer Haggerty, Esq.; Heslin Rothenberg Farley & Mesiti P.C.; George S. Blasiak, Esq.

(57) ABSTRACT

Methods, system, and computer program product are disclosed for enhanced system level testing of an AI hardware accelerator comprising Artificial Intelligence (AI) primitives. The system level testing provides uncompromised test coverage of the AI hardware accelerator while enabling efficient and effective testing performance. Enhanced test data generation, result prediction, and test execution are provided for system level testing of AI hardware accelerator including the AI primitives.

20 Claims, 11 Drawing Sheets

(56) References Cited

U.S. PATENT DOCUMENTS

| | | | | |
|---|---|---|---|---|
| 2024/0176486 | A1 | 5/2024 | Duale et al. | |
| 2024/0232502 | A9* | 7/2024 | Chiranjeevi | G06F 30/398 |

OTHER PUBLICATIONS

Kundu et al., "Detecting Functional Safety Violations in Online AI Accelerators" 2022 IEEE 28th International Symposium on On-Line Testing and Robust System Design (IOLTS), Sep. 12-14, 2022, pp. 1-4, DOI: 10.1109/IOLTS56730.2022.9897702.

Kishore Sugall et al., "Software Testing: Issues and Challenges of Artificial Intelligence & Machine Learning." International Journal of Artifical Intelligence and Applications (IJAIA), vol. 12, No. 1, Dated Jan. 2021, pp. 1-12.

Stefan Schonig et al., "Deep Learning Process Prediction with Discrete and Continuous Data Features," In Proceedings of the 13th International Conference on Evaluation of Novel Approaches to Software Engineering (ENASE), Year: 2018, pp. 314-319.

Authors et al., "An Intelligent Method to Dynamically Organize Multiple Tabs in a Browser," IP.com, IP.com No. IPCOM000266842D, Dated: Aug. 26, 2021, pp. 1-10.

Fabio D'Ottaviano, "Prediction with Data from Designed Experimentation," IP.com, IP.com No. IPCOM000266689D, Dated: Aug. 10, 2021, pp. 1-36.

Authors et al., "System and Method for Reducing False Positives in the Failure Prediction of an Operating System," IP. com, IP.com No. IPCOM000266634D, Dated: Aug. 4, 2021, pp. 1-11.

List of IBM Patents or Patent Applications Treated as Related, for U.S. Appl. No. 18/059,664, filed Nov. 29, 2022.

* cited by examiner

SYSTEM LEVEL TESTING OF ARTIFICIAL INTELLIGENCE PRIMITIVES

BACKGROUND

The present invention relates to the data processing field, and more specifically, to system level testing of an Artificial Intelligence (AI) hardware accelerator comprising AI primitives.

Testing of a complicated AI hardware accelerator is not possible using conventional test generation techniques due to the prohibitively large space and time consumed. Operations for system level testing AI primitives in the AI hardware accelerator include test generation time and result prediction time that would be prohibitive without new techniques, to provide effective test coverage. In the event an error is detected in the AI hardware accelerator being tested, effective error analysis and printing would not be possible using conventional test generation techniques due to the test data size for the detected error.

As used in the following description and claims, the term AI primitives should be broadly understood to include a plurality function codes that implement an Artificial Intelligence (AI) hardware accelerator comprising AI primitives.

SUMMARY

In accordance with disclosed embodiments, enhanced computer implemented methods are provided for system level testing of an Artificial Intelligence (AI) AI hardware accelerator comprising AI primitives. The disclosed methods provide uncompromised test coverage of the AI hardware accelerator while enabling efficient and effective testing performance in system test space and test time consumed.

In accordance with disclosed embodiments, a non-limiting computer implemented method reduces test generation time, result prediction time, and execution time for system level testing of AI primitives enables efficient testing performance and provides effective test coverage. The disclosed method comprises providing a test input data comprising valid test input data. The test input data is executed on a first function code (FC 1) in a hardware chain of multiple N function codes provided by an Artificial Intelligence (AI) hardware accelerator, the FC 1 output is applied to the next FC 2 in the hardware chain and a separate FC 1 output is provided. The FC1 output is executed on FC 2, the FC 2 output is applied to a next FC and a separate FC 2 output is provided. The process is continued until an output of FC_N−1 is applied to a last FC_N in the chain and executed, and the FC_N output provides an AI hardware output. For result prediction, the test input is executed on a simulated FC 1 in a software chain of multiple simulated N function codes, the simulated FC1 output is applied to a simulated FC 2. The simulated FC 1 output is executed on the simulated FC 2, a simulated FC 2 output is applied to a next simulated FC. The process is continued until an output of simulated FC_N−1 is applied to a last simulated FC_N in the chain and executed, and the simulated FC_N output provides an expected or result prediction output. The AI hardware output and the expected result output are compared to validate AI primitives of the AI hardware accelerator.

In accordance with disclosed embodiments, another non-limiting computer implemented method for system level testing of AI primitives enables reducing required time for both error data miscompare dumping and analysis and error miscompare output printing. The disclosed method comprises identifying an error or error condition on AI execution of the AI primitive function codes where the AI hardware output and the expected result output mismatch. The result prediction simulation code is traversed to find an error data-miscompare element location or error element address resulting in the mismatching of the AI hardware output and the expected result output. A data range is identified of one or more inputs to the identified error data-miscompare element location. Data tracing starting at a line or page of the data inputs containing the identified error data-miscompare element location is performed until the identified error data-miscompare element location is reached. Data tracing is turned off after reaching the identified error data-miscompare element location. Printing is only provided for one or more involved input data elements identified from data tracing.

Other disclosed embodiments include a computer system and computer program product for system level testing of AI primitives implementing features of the above-disclosed methods.

DETAILED DESCRIPTION

Figure 1:
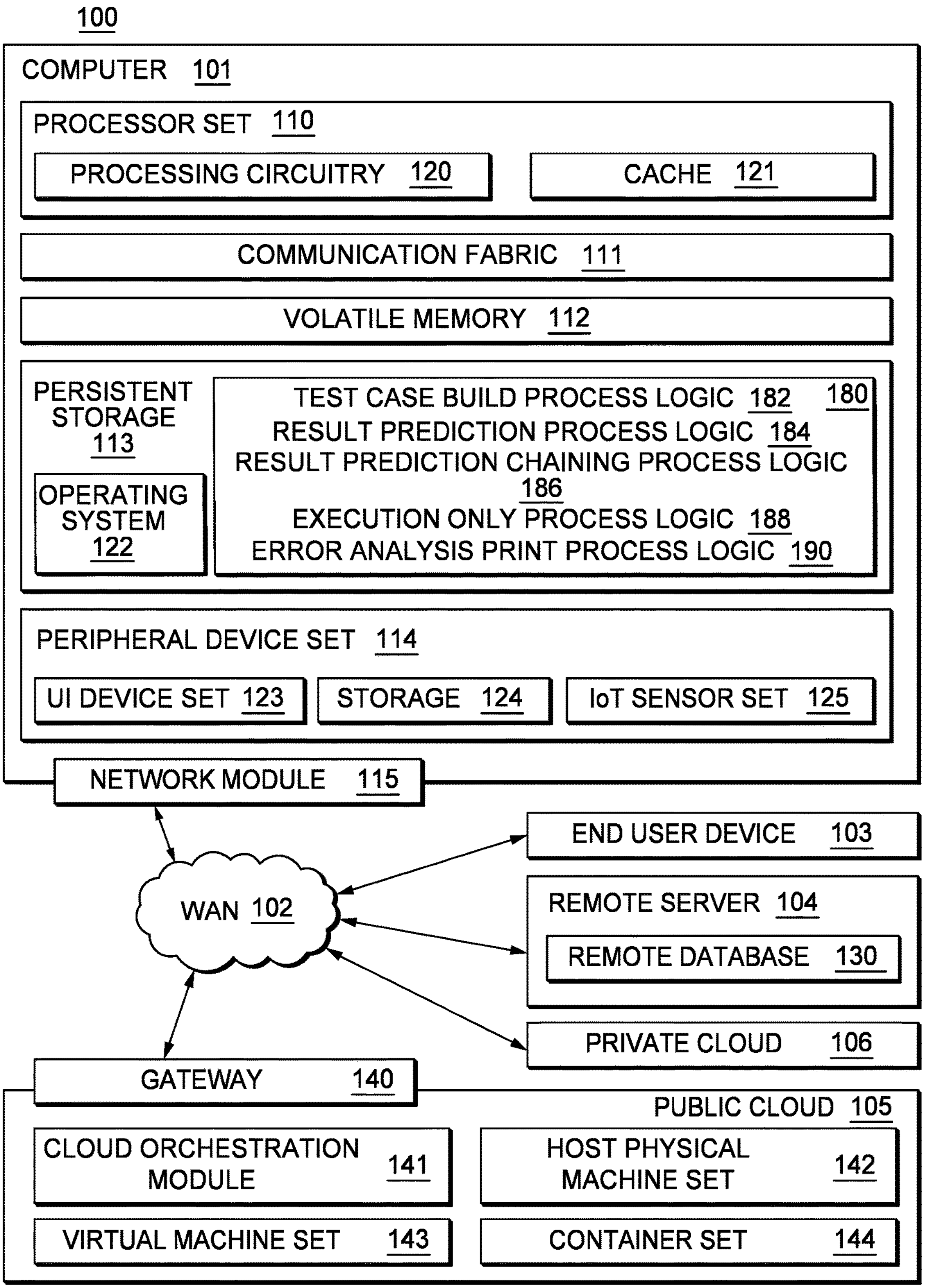
FIG. 1 is a block diagram of an example computer environment for use in conjunction with one or more disclosed embodiments for system level testing of AI primitives.

Test system and methods are provided for system level testing of Artificial Intelligence (AI) primitives in an AI Accelerator that provide effective, uncompromised test coverage while enabling efficient and effective testing performance in both space and time consumed.

An AI hardware accelerator or AI Accelerator can include a plurality of AI primitives. AI primitives comprise function codes that implement the AI primitives. Many of the function codes of AI primitives operate on four dimensional matrices and each dimension can be as large as 32K. For example, function codes of AI primitives can include LOG, EXP, ADD, SUB, MAX, MIN, MUL, DIV, B-NORM, SIGMOID, TANH, MATMUL, CONVOLUSION, MAX-POOL, AVG POOL, LSTM, GRU and the like Test time can be reduced by generating a test case that produces effective test coverage for system level testing of the AI hardware primitives. In one embodiment, valid input data is generated comprising a first selected (small) number of seed units (which can range, for example from a single AI input data element to multiple input data pages). Random units are selected from the seed units to generate a second selected (larger) number of units, wherein a combination of the seed units and the second selected number of units provide a final test case build and satisfy a data unit threshold for testing the AI hardware accelerator.

In another embodiment, result prediction time and test execution time can be reduced by providing an initial small set of input data that is replicated to produce multiple identical units of input data. Each of the multiple identical units is executed on the AI hardware accelerator to provide a first output. For result prediction, the initial small set of input data is simulated using a software version of the AI accelerator to produce a result prediction output that is replicated to generate an expected result output which is the same size as the first output of the AI hardware accelerator. The hardware and software generated outputs are compared to validate the AI hardware accelerator.

Another embodiment enables fast effective test coverage and reduction of test execution time by hardware execution of the multiple function codes without using much slower software processing for result prediction. A daisy chain of multiple function codes comprising the AI primitives is configured by the hardware accelerator for system level testing of the hardware accelerator. Chaining the respective function codes eliminates the need for generating multiple different test input data for each of the multiple function codes of conventional testing arrangements. Test input data is processed by an AI hardware accelerator, in a first run, using the daisy chain of multiple function codes to generate a first hardware accelerator output. In a second run, either the same test input data or modified test input data is processed using the daisy chain of multiple function codes to generate a second hardware accelerator output. The first and second outputs of the first and second runs with the same test input data are compared to validate a functionality of the daisy chain of multiple function codes. Test execution consistency is identified when modified test input data is processed during another run. For example, when modified test input data is being processed an error or error condition can be identified by a check stop or timeout on the daisy chain of multiple function codes comprising AI primitives.

Another disclosed embodiment enables reduction of the required time for error data-miscompare dumping and analysis and error miscompare printing of system level testing for the complex hardware accelerator. An error or error condition is identified where the AI hardware output and the expected result output mismatch. The result prediction simulation code is traversed, without doing any result computations such as additions and multiplications, to find an error data-miscompare element location or starting error data-miscompare element address resulting in the mismatching of the AI hardware output and the expected result output. A data range is identified of one or more inputs to the identified error data-miscompare element location/address. Data debug tracing starting at a line or page of the data inputs containing the identified starting error data-miscompare element location is performed until the identified error data-miscompare element location is reached. Data debug tracing is turned off after reaching the identified starting error element location. Printing is only provided for involved input data elements identified from data tracing, which significantly reduces printing time as compared to other techniques. It should be understood that error printing includes writing test case information, including the test case input and output, into an output file.

Various aspects of the present disclosure are described by narrative text, flowcharts, block diagrams of computer systems and/or block diagrams of the machine logic included in computer program product (CPP) embodiments. With respect to any flowcharts, depending upon the technology involved, the operations can be performed in a different order than what is shown in a given flowchart. For example, again depending upon the technology involved, two operations shown in successive flowchart blocks may be performed in reverse order, as a single integrated step, concurrently, or in a manner at least partially overlapping in time.

A computer program product embodiment ("CPP embodiment" or "CPP") is a term used in the present disclosure to describe any set of one, or more, storage media (also called "mediums") collectively included in a set of one, or more, storage devices that collectively include machine readable code corresponding to instructions and/or data for performing computer operations specified in a given CPP claim. A "storage device" is any tangible device that can retain and store instructions for use by a computer processor. Without limitation, the computer readable storage medium may be an electronic storage medium, a magnetic storage medium, an optical storage medium, an electromagnetic storage medium, a semiconductor storage medium, a mechanical storage medium, or any suitable combination of the foregoing. Some known types of storage devices that include these mediums include: diskette, hard disk, random access memory (RAM), read-only memory (ROM), erasable programmable read-only memory (EPROM or Flash memory), static random access memory (SRAM), compact disc read-only memory (CD-ROM), digital versatile disk (DVD), memory stick, floppy disk, mechanically encoded device (such as punch cards or pits/lands formed in a major surface of a disc) or any suitable combination of the foregoing. A computer readable storage medium, as that term is used in the present disclosure, is not to be construed as storage in the form of transitory signals per se, such as radio waves or other freely propagating electromagnetic waves, electromagnetic waves propagating through a waveguide, light pulses passing through a fiber optic cable, electrical signals communicated through a wire, and/or other transmission media. As will be understood by those of skill in the art, data is typically moved at some occasional points in time during normal operations of a storage device, such as during access, de-fragmentation or garbage collection, but this does not render the storage device as transitory because the data is not transitory while it is stored.

With reference now to FIG. 1, there is shown an example computing environment 100. Computing environment 100 contains an example of an environment for the execution of at least some of the computer code involved in performing inventive methods for system level testing of AI primitives at block 180, such as logic for system level testing of AI primitives 180, test case build process logic 182, result prediction process logic 184, result prediction chaining process logic 186, execution only process logic 188 and error analysis print process logic 190. In addition to block 180, computing environment 100 includes, for example, computer 101, wide area network (WAN) 102, end user device (EUD) 103, remote server 104, public cloud 105, and private cloud 106. In this embodiment, computer 101 includes processor set 110 (including processing circuitry 120 and cache 121), communication fabric 111, volatile memory 112, persistent storage 113 (including operating system 122 and block 180, as identified above), peripheral device set 114 (including user interface (UI) device set 123, storage 124, and Internet of Things (IOT) sensor set 125), and network module 115. Remote server 104 includes remote database 130. Public cloud 105 includes gateway 140, cloud orchestration module 141, host physical machine set 142, virtual machine set 143, and container set 144.

Computer 101 may take the form of a desktop computer, laptop computer, tablet computer, smart phone, smart watch or other wearable computer, mainframe computer, quantum computer or any other form of computer or mobile device now known or to be developed in the future that is capable of running a program, accessing a network or querying a database, such as remote database 130. As is well understood in the art of computer technology, and depending upon the technology, performance of a computer-implemented method may be distributed among multiple computers and/or between multiple locations. On the other hand, in this presentation of computing environment 100, detailed discussion is focused on a single computer, specifically computer 101, to keep the presentation as simple as possible. Computer 101 may be located in a cloud, even though it is not shown in a cloud in FIG. 1. On the other hand, computer 101 is not required to be in a cloud except to any extent as may be affirmatively indicated.

Processor Set 110 includes one, or more, computer processors of any type now known or to be developed in the future. Processing circuitry 120 may be distributed over multiple packages, for example, multiple, coordinated integrated circuit chips. Processing circuitry 120 may implement multiple processor threads and/or multiple processor cores. Cache 121 is memory that is located in the processor chip package(s) and is typically used for data or code that should be available for rapid access by the threads or cores running on processor set 110. Cache memories are typically organized into multiple levels depending upon relative proximity to the processing circuitry. Alternatively, some, or all, of the cache for the processor set may be located “off chip.” In some computing environments, processor set 110 may be designed for working with qubits and performing quantum computing.

Computer readable program instructions are typically loaded onto computer 101 to cause a series of operational steps to be performed by processor set 110 of computer 101 and thereby effect a computer-implemented method, such that the instructions thus executed will instantiate the methods specified in flowcharts and/or narrative descriptions of computer-implemented methods included in this document (collectively referred to as “the inventive methods”). These computer readable program instructions are stored in various types of computer readable storage media, such as cache 121 and the other storage media discussed below. The program instructions, and associated data, are accessed by processor set 110 to control and direct performance of the inventive methods. In computing environment 100, at least some of the instructions for performing the inventive methods may be stored in block 180 in persistent storage 113.

Communication Fabric 111 is the signal conduction path that allows the various components of computer 101 to communicate with each other. Typically, this fabric is made of switches and electrically conductive paths, such as the switches and electrically conductive paths that make up busses, bridges, physical input/output ports and the like. Other types of signal communication paths may be used, such as fiber optic communication paths and/or wireless communication paths.

Volatile Memory 112 is any type of volatile memory now known or to be developed in the future. Examples include dynamic type random access memory (RAM) or static type RAM. Typically, volatile memory 112 is characterized by random access, but this is not required unless affirmatively indicated. In computer 101, the volatile memory 112 is located in a single package and is internal to computer 101, but, alternatively or additionally, the volatile memory may be distributed over multiple packages and/or located externally with respect to computer 101.

Persistent Storage 113 is any form of non-volatile storage for computers that is now known or to be developed in the future. The non-volatility of this storage means that the stored data is maintained regardless of whether power is being supplied to computer 101 and/or directly to persistent storage 113. Persistent storage 113 may be a read only memory (ROM), but typically at least a portion of the persistent storage allows writing of data, deletion of data and re-writing of data. Some familiar forms of persistent storage include magnetic disks and solid state storage devices. Operating system 122 may take several forms, such as various known proprietary operating systems or open source Portable Operating System Interface-type operating systems that employ a kernel. The code included in block 180 typically includes at least some of the computer code involved in performing the inventive methods.

Peripheral Device Set 114 includes the set of peripheral devices of computer 101. Data communication connections between the peripheral devices and the other components of computer 101 may be implemented in various ways, such as Bluetooth connections, Near-Field Communication (NFC) connections, connections made by cables (such as universal serial bus (USB) type cables), insertion-type connections (for example, secure digital (SD) card), connections made through local area communication networks and even connections made through wide area networks such as the internet. In various embodiments, UI device set 123 may include components such as a display screen, speaker, microphone, wearable devices (such as goggles and smart watches), keyboard, mouse, printer, touchpad, game controllers, and haptic devices. Storage 124 is external storage, such as an external hard drive, or insertable storage, such as an SD card. Storage 124 may be persistent and/or volatile. In some embodiments, storage 124 may take the form of a quantum computing storage device for storing data in the form of qubits. In embodiments where computer 101 is required to have a large amount of storage (for example, where computer 101 locally stores and manages a large database) then this storage may be provided by peripheral storage devices designed for storing very large amounts of data, such as a storage area network (SAN) that is shared by multiple, geographically distributed computers. IoT sensor set 125 is made up of sensors that can be used in Internet of Things applications. For example, one sensor may be a thermometer and another sensor may be a motion detector.

Network Module 115 is the collection of computer software, hardware, and firmware that allows computer 101 to communicate with other computers through WAN 102. Network module 115 may include hardware, such as modems or Wi-Fi signal transceivers, software for packetizing and/or de-packetizing data for communication network transmission, and/or web browser software for communicating data over the internet. In some embodiments, network control functions and network forwarding functions of network module 115 are performed on the same physical hardware device. In other embodiments (for example, embodiments that utilize software-defined networking (SDN)), the control functions and the forwarding functions of network module 115 are performed on physically separate devices, such that the control functions manage several different network hardware devices. Computer readable program instructions for performing the inventive methods can typically be downloaded to computer 101 from an external computer or external storage device through a network adapter card or network interface included in network module 115.

WAN 102 is any wide area network (for example, the internet) capable of communicating computer data over non-local distances by any technology for communicating computer data, now known or to be developed in the future. In some embodiments, the WAN 102 may be replaced and/or supplemented by local area networks (LANs) designed to communicate data between devices located in a local area, such as a Wi-Fi network. The WAN and/or LANs typically include computer hardware such as copper transmission cables, optical transmission fibers, wireless transmission, routers, firewalls, switches, gateway computers and edge servers.

End User Device (EUD) 103 is any computer system that is used and controlled by an end user (for example, a customer of an enterprise that operates computer 101), and may take any of the forms discussed above in connection with computer 101. EUD 103 typically receives helpful and useful data from the operations of computer 101. For example, in a hypothetical case where computer 101 is designed to provide a recommendation to an end user, this recommendation would typically be communicated from network module 115 of computer 101 through WAN 102 to EUD 103. In this way, EUD 103 can display, or otherwise present, the recommendation to an end user. In some embodiments, EUD 103 may be a client device, such as thin client, heavy client, mainframe computer, desktop computer and so on.

Remote Server 104 is any computer system that serves at least some data and/or functionality to computer 101. Remote server 104 may be controlled and used by the same entity that operates computer 101. Remote server 104 represents the machine(s) that collect and store helpful and useful data for use by other computers, such as computer 101. For example, in a hypothetical case where computer 101 is designed and programmed to provide a recommendation based on historical data, then this historical data may be provided to computer 101 from remote database 130 of remote server 104.

Public Cloud 105 is any computer system available for use by multiple entities that provides on-demand availability of computer system resources and/or other computer capabilities, especially data storage (cloud storage) and computing power, without direct active management by the user. Cloud computing typically leverages sharing of resources to achieve coherence and economics of scale. The direct and active management of the computing resources of public cloud 105 is performed by the computer hardware and/or software of cloud orchestration module 141. The computing resources provided by public cloud 105 are typically implemented by virtual computing environments that run on various computers making up the computers of host physical machine set 142, which is the universe of physical computers in and/or available to public cloud 105. The virtual computing environments (VCEs) typically take the form of virtual machines from virtual machine set 143 and/or containers from container set 144. It is understood that these VCEs may be stored as images and may be transferred among and between the various physical machine hosts, either as images or after instantiation of the VCE. Cloud orchestration module 141 manages the transfer and storage of images, deploys new instantiations of VCEs and manages active instantiations of VCE deployments. Gateway 140 is the collection of computer software, hardware, and firmware that allows public cloud 105 to communicate through WAN 102.

Some further explanation of virtualized computing environments (VCEs) will now be provided. VCEs can be stored as "images." A new active instance of the VCE can be instantiated from the image. Two familiar types of VCEs are virtual machines and containers. A container is a VCE that uses operating-system-level virtualization. This refers to an operating system feature in which the kernel allows the existence of multiple isolated user-space instances, called containers. These isolated user-space instances typically behave as real computers from the point of view of programs running in them. A computer program running on an ordinary operating system can utilize all resources of that computer, such as connected devices, files and folders, network shares, CPU power, and quantifiable hardware capabilities. However, programs running inside a container can only use the contents of the container and devices assigned to the container, a feature which is known as containerization.

Private Cloud 106 is similar to public cloud 105, except that the computing resources are only available for use by a single enterprise. While private cloud 106 is depicted as being in communication with WAN 102, in other embodiments a private cloud may be disconnected from the internet entirely and only accessible through a local/private network. A hybrid cloud is a composition of multiple clouds of different types (for example, private, community or public cloud types), often respectively implemented by different vendors. Each of the multiple clouds remains a separate and discrete entity, but the larger hybrid cloud architecture is bound together by standardized or proprietary technology that enables orchestration, management, and/or data/application portability between the multiple constituent clouds. In this embodiment, public cloud 105 and private cloud 106 are both part of a larger hybrid cloud.

A test system and methods for system level testing of an AI hardware accelerator comprising AI primitives of disclosed embodiments provide reliable and effective test coverage while enabling efficient and effective testing performance in both space and time consumed. The disclosed test system and methods enable testing of the AI hardware accelerator overcoming testing challenges where conventional test generation techniques would generally fail.

Figure 2:
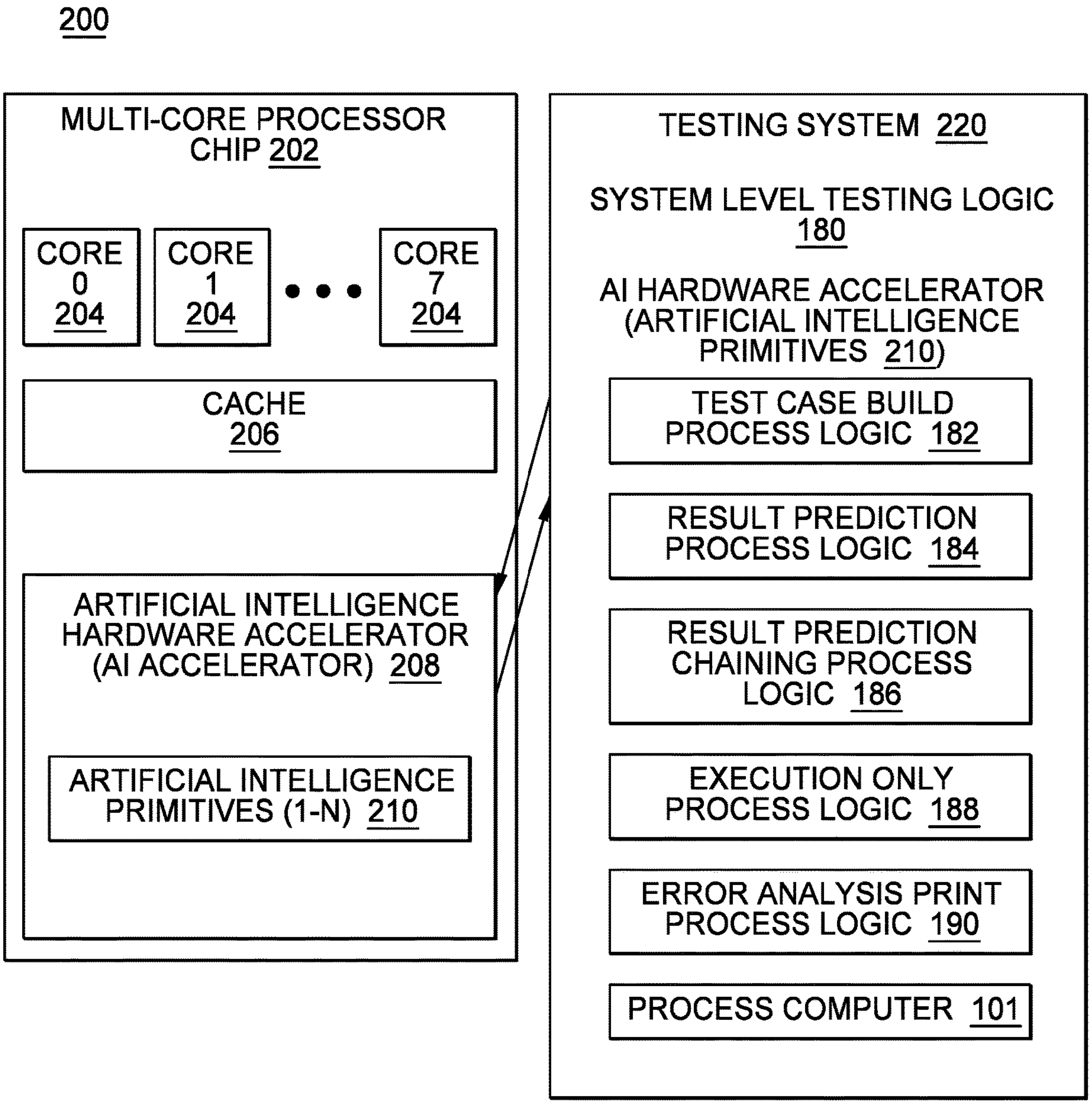
FIG. 2 is a block diagram of an example multi-core processor chip including an AI Accelerator and AI primitives for use in conjunction with a test system of one or more disclosed embodiments for system level testing of AI primitives.

With reference now to FIG. 2, there is shown an example test environment 200 includes an example multi-core processor chip 202 together with an example testing system 220 of disclosed embodiments for system level testing of a AI hardware accelerator 208. As shown, the multi-core processor chip 202 includes eight multiple processor cores 204, 0-7 and an associated cache 208, but can have any number of processor cores 204. The multi-core processor chip 202 includes the AI hardware accelerator or AI Accelerator 208 comprising a plurality of AI primitives 210. As shown, the AI accelerator 208 is hardware circuitry disposed on the same processor chip 202 as the cores 204. It should be understood that the disclosed embodiments are not limited to a multi-core processor chip and the AI accelerator 208 can be located on a separate chip external to a processor chip.

The AI hardware accelerator 208 is tested by testing system 220 of the disclosed embodiment. The AI hardware accelerator 208 includes the plurality of AI primitives 210, for example, 21 AI primitives. In one embodiment, the AI primitives 210, for example, comprise function codes that operate on four-dimensional matrices.

In one embodiment, the testing system 220 can be implemented using the computer 101 in FIG. 1. The testing system 220 includes system level testing logic 180 for system level testing the AI hardware accelerator 208. Testing system 220 further comprises test case build process logic 182, result prediction process logic 184, result prediction chaining process logic 186, execution only process logic 188 and error analysis and print process logic 190. System level testing logic 180, test case build process logic 182, result prediction process logic 184, result prediction chaining process logic 186, execution only process logic 188 and error analysis print process logic 190 are used together, for example with computer 101 of FIG. 1 to implement system level testing operations provided by testing system 220.

In accordance with disclosed embodiments, a non-limiting computer implemented method 300 is disclosed for system level testing of AI hardware accelerator 208 including AI primitives 210. The method 300 enables efficient testing performance and provides effective test coverage, while reducing data build test time for system level testing of the AI accelerator 208. Test data must satisfy certain requirements, which typically, makes generating test data a hands-on and time-consuming process for the data scientist. In the disclosed method 300, a data scientist can create a few units of valid input data (e.g., seed pages) that satisfy the data input requirements for testing the AI hardware accelerator comprising the hardware machine-learning accelerator 208. Method 300 may be implemented with computer 101 for example, system level testing of AI primitives logic 180 and test case build process logic 182 provide computer test control for test build operations performed for system level testing the hardware machine-learning accelerator 208.

Figure 3:
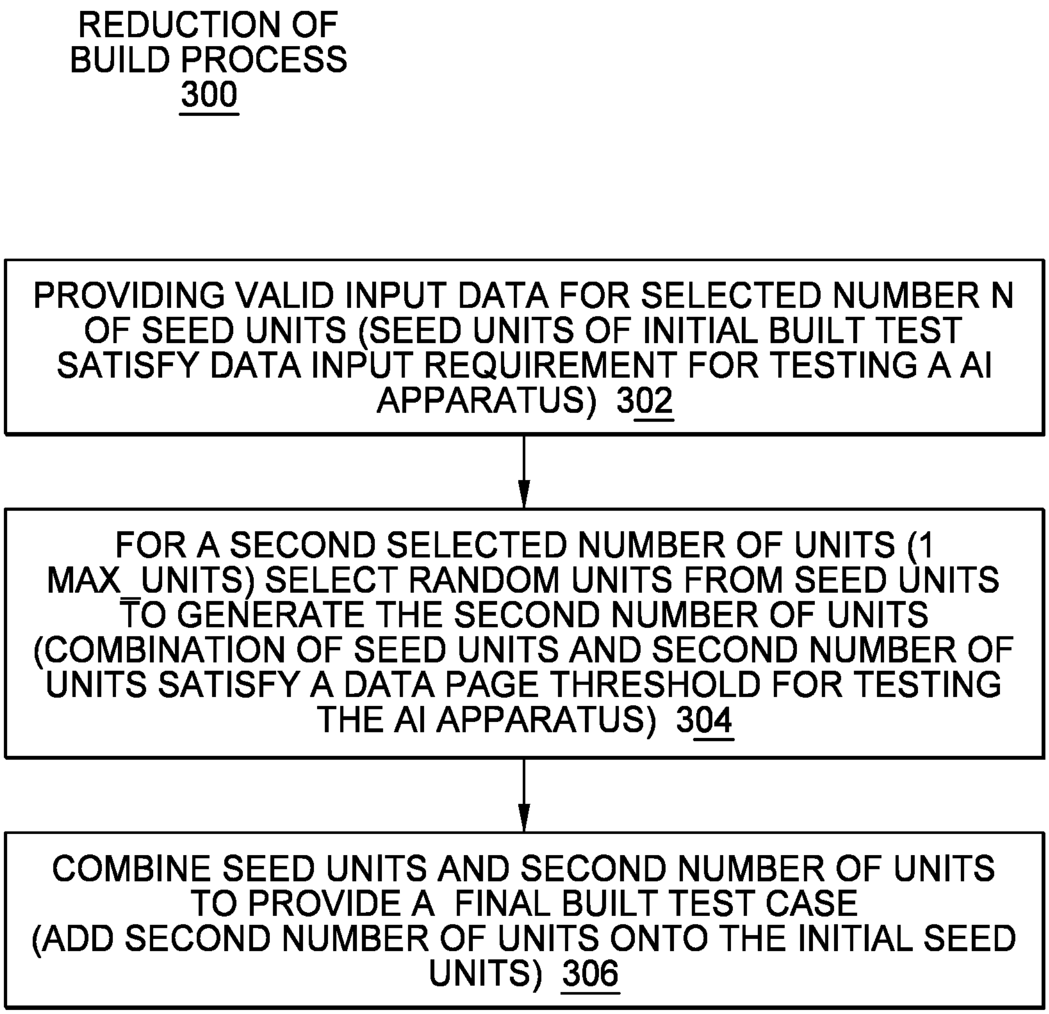
FIG. 3 is a flow chart illustrating example operations of a disclosed method that reduces test generation time for system level testing of AI primitives.

Referring to FIG. 3, as indicated at block 302, operations begin with providing valid input data comprising a first selected number of seed units. The valid input data supports testing of a predefined machine hardware implementation or hardware architecture of the AI hardware accelerator 208. The seed units satisfy a data input requirement for testing the AI hardware accelerator 208. For example, the seed units include a small number of units, such as 10 seed pages. Generating a sufficient number of seed units to fully test the AI accelerator would require a tremendous amount of time. Generating a small number of seed units that satisfy the day input requirement is not easy and can require a data scientist to generate the valid input data, while the generated seed units reduce the overall test data generation time for a final test case data build.

At block 304 for a second selected number of units, test case build process logic 182 selects random units of the initial seed units to generate the second selected number of units. Selecting random units from the seed units to generate the second selected number of units generates a much larger number of randomly selected units than the first selected number of seed units at block 304. At block 304, a test data generation time for selecting random units from the seed units to generate the second larger number of random units is much less than a test data generation time for providing the selected number of seed units of valid input data at block 302. The seed units and the large number of random units together satisfy a data unit threshold for testing the AI hardware accelerator 208. The data unit threshold is based on predefined test data requirements to provide effective test coverage for system level testing of functionality and behavior of AI hardware primitives 210 of the AI hardware accelerator 208. At block 306, test case build process logic 182 combines the seed units and the second selected number of units to provide a final test case build for testing the AI hardware accelerator. For example, test case build process logic 182 adds the second selected random unit onto the initial seed units to provide the final built test data case at block 306. As an example, a data scientist may generate 10 seed units, from which, the test case build process logic 182 randomly selects the next 100 units to generate the final built test data. For instance, the test case build process logic 182 may randomly select as the $11^{th}$ unit in the test data the $2^{nd}$ seed unit, may randomly select as the $12^{th}$ unit in the test data the $8^{th}$ seed unit, may randomly select as the $13^{th}$ unit in the test data the $2^{nd}$ seed stage, and so forth.

The final built test data case enables system level testing of the AI hardware accelerator 208 including the AI hardware accelerator 208 comprising AI primitives 210 including the functionality and behavior of the AI hardware primitives 210. The final built test data case including the data unit threshold of test pages enables system level testing of the AI hardware primitives 210 providing effective, uncompromised test coverage and enabling efficient and effective testing performance.

Figure 4:
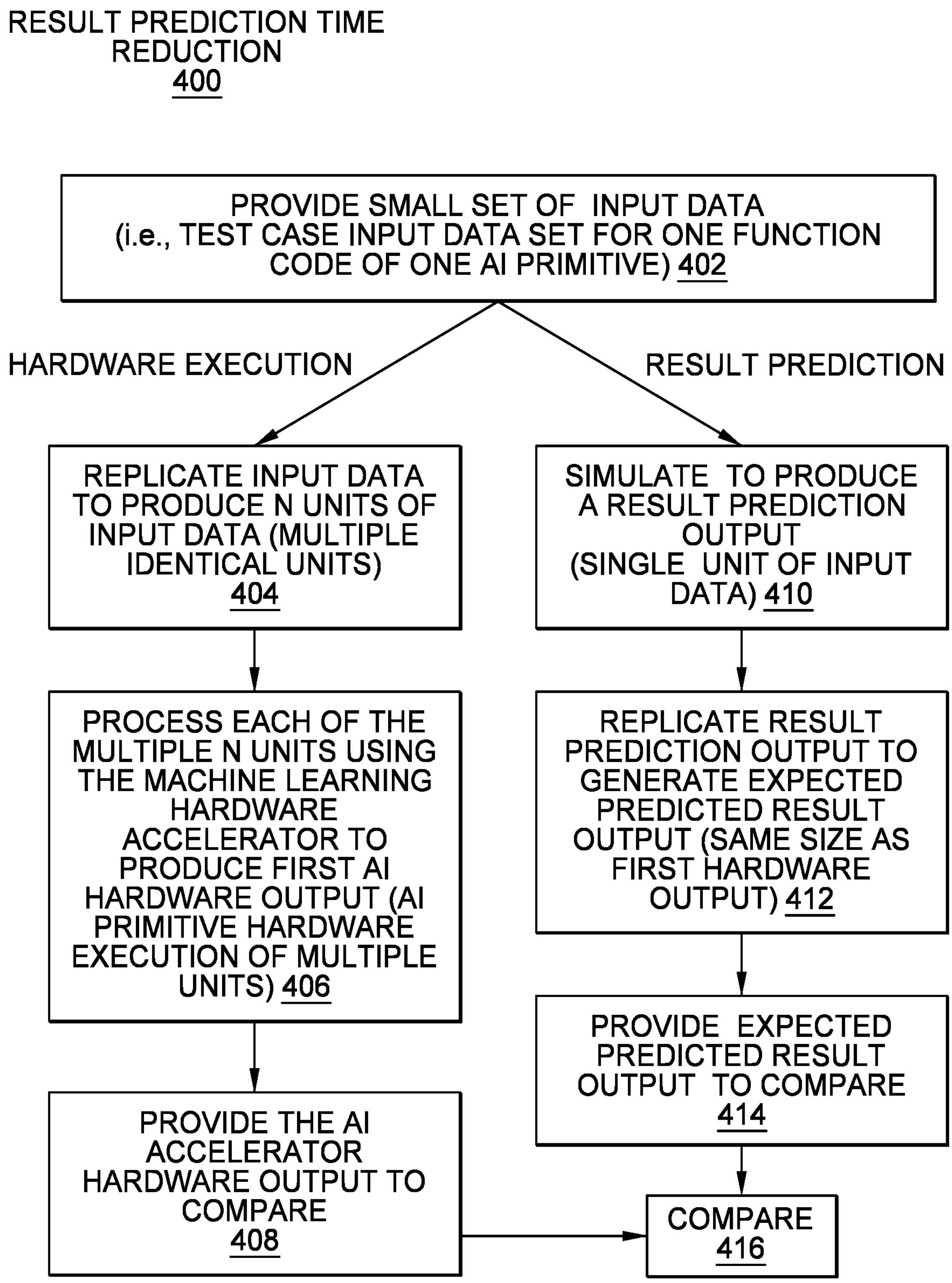
FIG. 4 is a flow chart illustrating example operations of a disclosed method that reduces result prediction time for system level testing of AI primitives.
Figure 8:
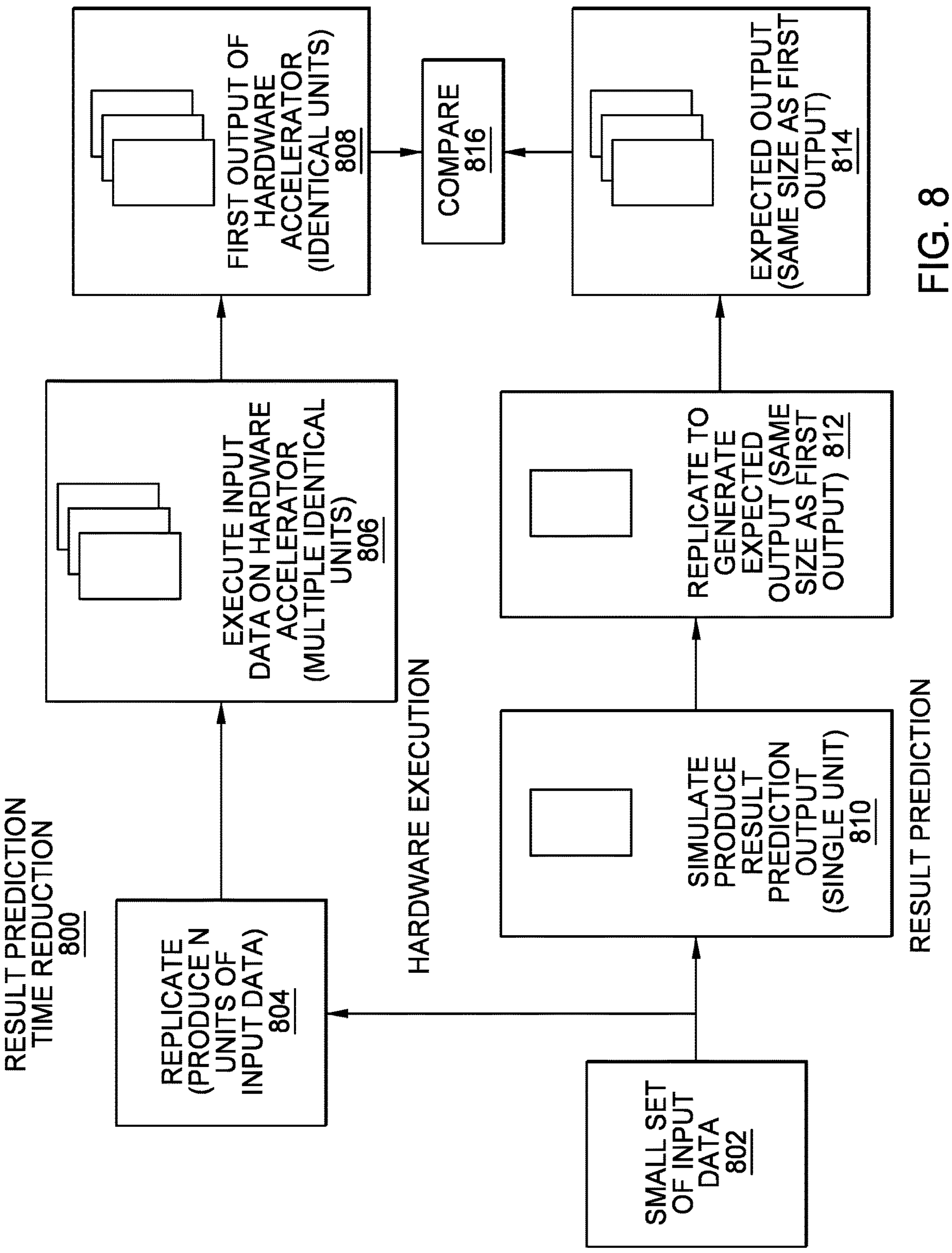
FIG. 8 is a block diagram illustrating an example operational configuration for system level testing of AI primitives for reducing result prediction time of one or more disclosed embodiments.

Referring to FIG. 4, example system level testing operations of a method 400 are shown. Referring also to FIG. 8, an example system operational configuration 800 is shown for reducing result prediction time for system level testing of AI hardware accelerator 208. In accordance with disclosed embodiments, the non-limiting computer implemented method 400 reduces result prediction time for system level testing of AI hardware accelerator including AI primitives 210. Method 400 may be implemented with computer 101 for example, with system level testing of hardware AI primitives logic 180 and result prediction process logic 184 to provide computer control for operations performed by a software machine-learning model testing of simulated machine learning functions.

The respective operations and system operational components are described as blocks with the reference numbers illustrated for method 400 and system operational components 800 in FIGS. 4 and 8.

As indicated at block 402 in FIG. 4 and system block 802 in FIG. 8, a selected small set of input data is provided. At block 404 in FIG. 4 and block 804 in FIG. 8 for hardware execution operations, system level testing of hardware AI primitives logic 180 replicates the set of input data to produce a large number of N units of input data, such as multiple N identical pages of input data. At blocks 404 and 804, system level testing of hardware AI primitives logic 180 replicates the set of input data to provide a data unit threshold for effective testing the hardware test execution for the AI hardware accelerator 208. That is a small set of input data is replicated to provide, for example a large number of test data units to satisfy system level testing requirements of the AI hardware accelerator 208. At blocks 406 and 806, each of the multiple units is processed or executed using the hardware machine-learning accelerator 208 to provide a first output. At block 408 and 808, the first hardware output is provided to a compare block 416 and 816.

For result prediction, a software AI model is used for processing the set of input data for testing simulated AI functions. The software AI model simulates AI function codes of AI primitives 210 of the AI hardware accelerator 208 for software execution for example, with computer 101 together with result prediction process logic 184 providing computer control for operations performed by method 400.

For result prediction, at block 410 and 810, the set of input data is processed using a software AI model to produce a result prediction output that is smaller than the multiple N units produced by the hardware machine-learning accelerator 208. For example, the result prediction output processed by the software AI model at block 410 and 810 could be a single unit, for example a single page. If the software simulation of the AI model processed the same number of units as the hardware accelerator, it would take it much longer (e.g., days, months or even more). In this configuration, both the hardware and software paths can execute in about the same amount of time and by simply replicating the output of the software path provides the same size outputs to compare. At block 412 and 812, the result prediction output is replicated to generate an expected predicted result output, which is the same size as the first output provided to the compare block 416. At block 414 and 814, the expected predicted result output is provided to the compare block 416 and 816. The first output and the expected result output are compared to validate the AI hardware accelerator at block 416 and 816. That is, if there is a difference, it can indicate a flaw in the hardware accelerator.

Figure 5:
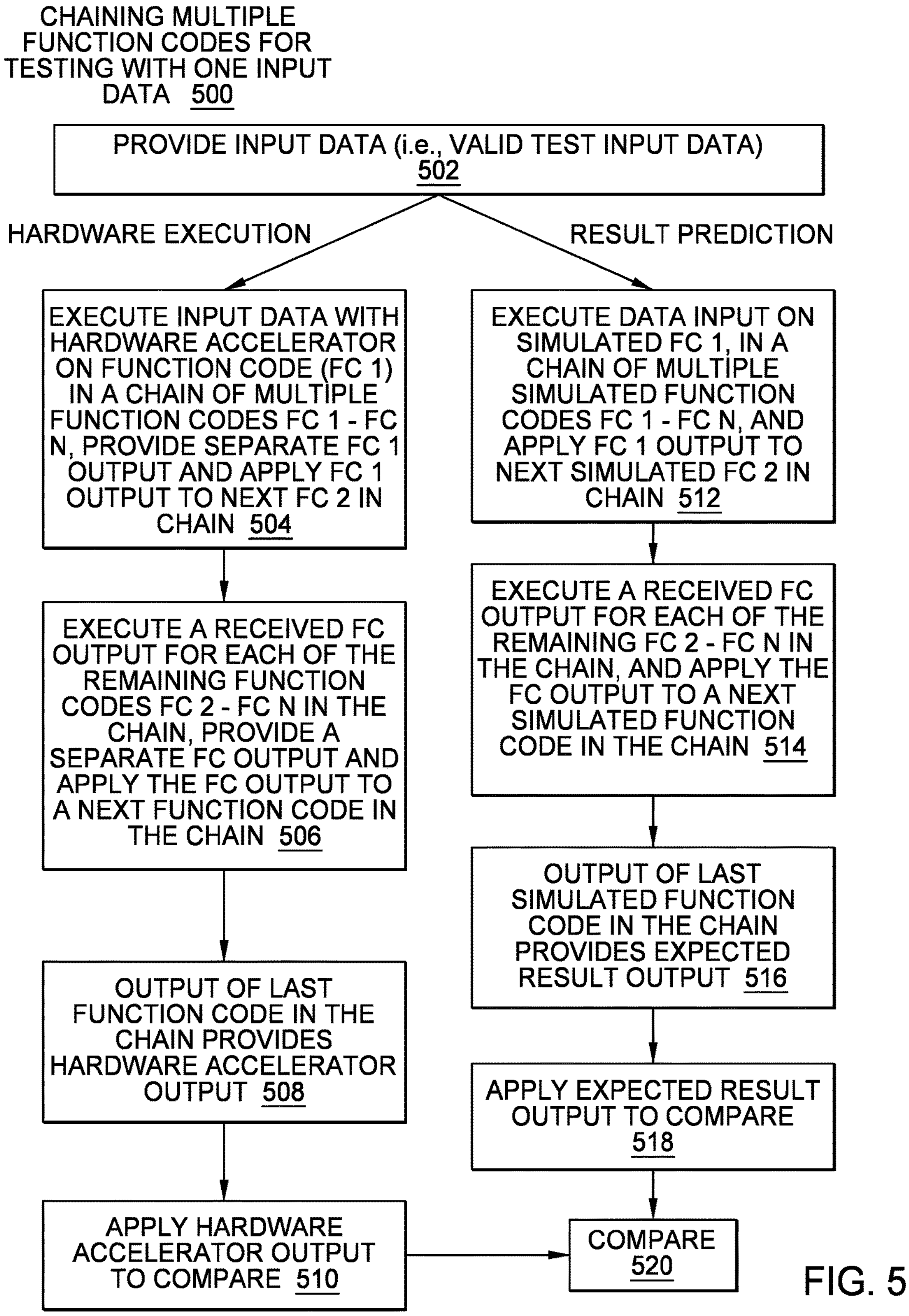
FIG. 5 is a flow chart illustrating example operations of a disclosed method that reduces test generation time for system level testing of AI primitives.
Figure 9:
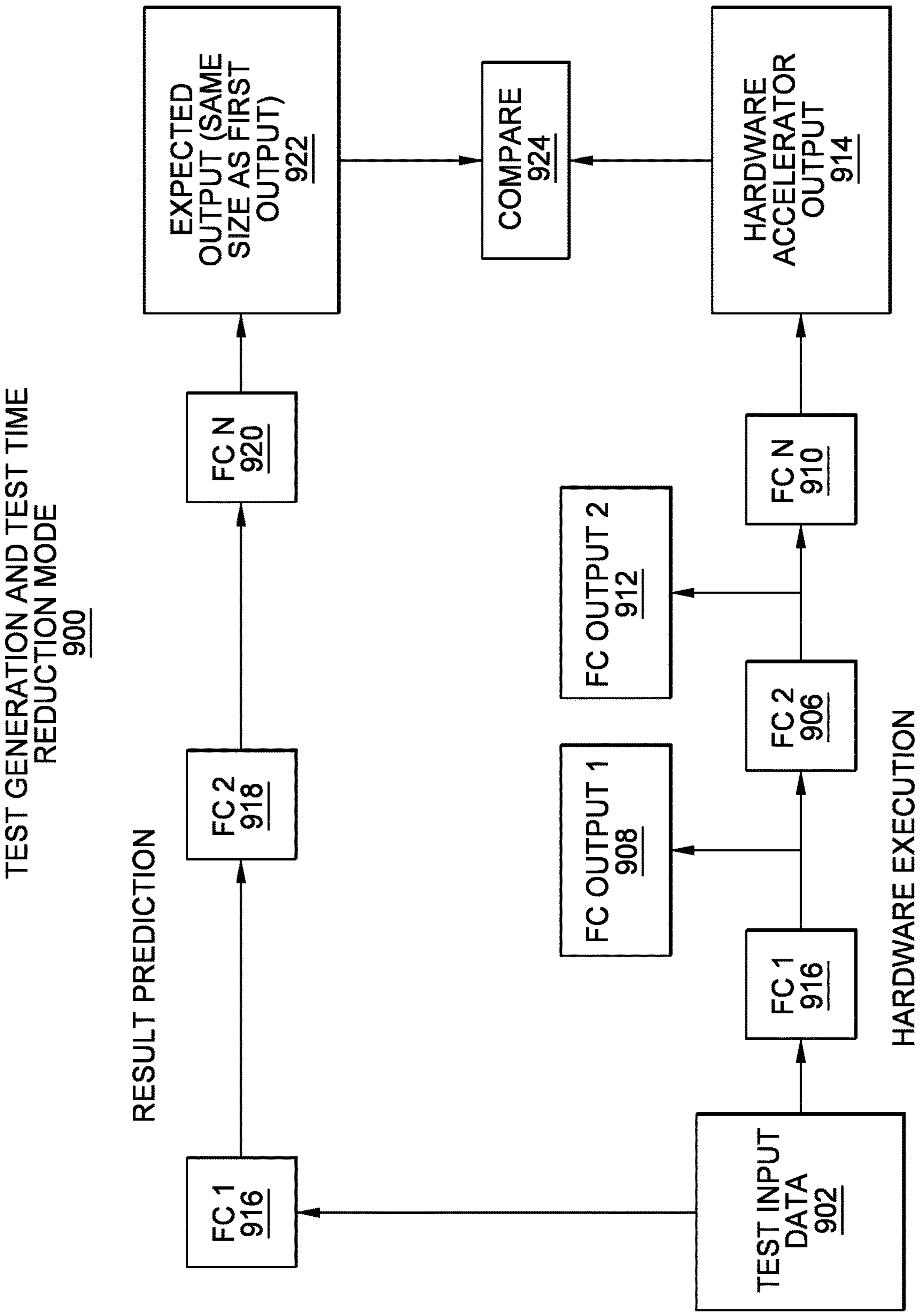
FIG. 9 is a block diagram illustrating an example operational configuration for system level testing of AI primitives for reducing test generation time and oveall test time of one or more disclosed embodiments.

Referring to FIG. 5, example system level testing operations for method 500 are shown. Referring also to FIG. 9, an example system operational configuration 900 is shown for reducing test generation time and test time for system level testing of AI hardware accelerator 208. The non-limiting computer implemented method 500 reduces test result prediction time and execution time for system level testing of AI hardware accelerator 208 comprising AI primitives 210, enabling efficient testing performance and effective test coverage. Method 500 may be implemented with computer 101 for example, system level testing of AI primitives logic 180, and result prediction chaining process logic 186 provides an example computer test control for operations performed of method 500 of the disclosed embodiments. The respective operations and system operational components in the following are described as blocks with the reference numbers illustrated for method 500 and system operational components 900 in FIGS. 5 and 9.

As shown, system operational configuration 900 includes a single test input data 902 providing test input data to a chain of AI hardware function codes (FCs 1)-FC N 904, 906, 910 and to a chain of simulated function codes FC1-FCN 916, 918, 920. The AI hardware function codes (FCs 1)-FC N 904, 906, 910 comprise AI primitives that include for example, RELU, ADD. SUB, MAXPOOL, and the like. Each of the AI hardware function codes FC 1-FC N 904, 906, 910 provide a separate FC output 1, 2, N 908, 912, 914 with the last FC N 910 providing the AI hardware accelerator output 914. The chain of simulated function codes FC1-FCN 916, 918, 920 provide an expected result output 922. A compare 924 receives and compares the AI hardware accelerator output and expected output to validate the AI hardware accelerator 208.

Typically, in conventional testing arrangements, a separate test input data is provided for separately testing each of the multiple hardware function codes comprising the AI primitives 208. Chaining multiple function codes avoids the effort and time required to generate multiple different test input data as required for each of the respective multiple function codes of conventional testing arrangements.

In method 500 and the operational mode 900 in FIGS. 5 and 9, operations begin with providing input data, i.e., valid test input data as indicated at blocks 502 and 902. The test input data is generated for example to meet a threshold testing requirement for a specific one of the multiple hardware function codes. The same test input data is applied to the respective input the chain of simulated function codes and to the AI hardware accelerator chain of hardware function codes, while providing effective test coverage. As a result test generation time is reduced for system level testing of AI hardware accelerator 208.

At blocks 504 and 904, the input data is executed by the AI hardware accelerator 208 on a first hardware function code FC 1 in a chain of multiple hardware function codes provided by the AI hardware accelerator 208. At blocks 504 and 904, a hardware function code output of FC 1 is applied to a next hardware function code FC2, 906 in the chain, and a separate hardware function code output FC OUTPUT 1, 908 is provided.

At block 506, a respective received hardware function code output is executed for each of the remaining hardware function codes FC2-FC N in the chain, applying a hardware function code output to a next hardware function code in the chain, and providing a separate hardware function code output FC OUTPUT 2, 912. At block 508, the output of the last hardware function code FC N, 910 in the chain provides a AI hardware accelerator output 914 that is applied to a compare at blocks 510, 924. At block 512, the test input data is executed by a software machine learning model, on a first simulated function code FC1, 916 in a chain of multiple simulated function codes, FC1-FC N, applying a simulated function code output to a next simulated function code in the chain. At block 514, a received simulated function code output is executed for each of the remaining simulated function codes FC2, 918-FC N, 920 in the chain and a simulated function code output is applied to a next simulated function code in the chain. At block 516, the last simulated function code FC N, 920 in the chain provides an expected result output 922 that is applied to the compare at blocks 518, 924. At blocks 520 and 924, the AI hardware accelerator output 914 and the expected result output 922 are compared to validate the AI hardware accelerator. The AI hardware accelerator output 914 must match the predicted result output 922 to validate correct operation of the AI hardware accelerator 208 under test.

Figure 6:
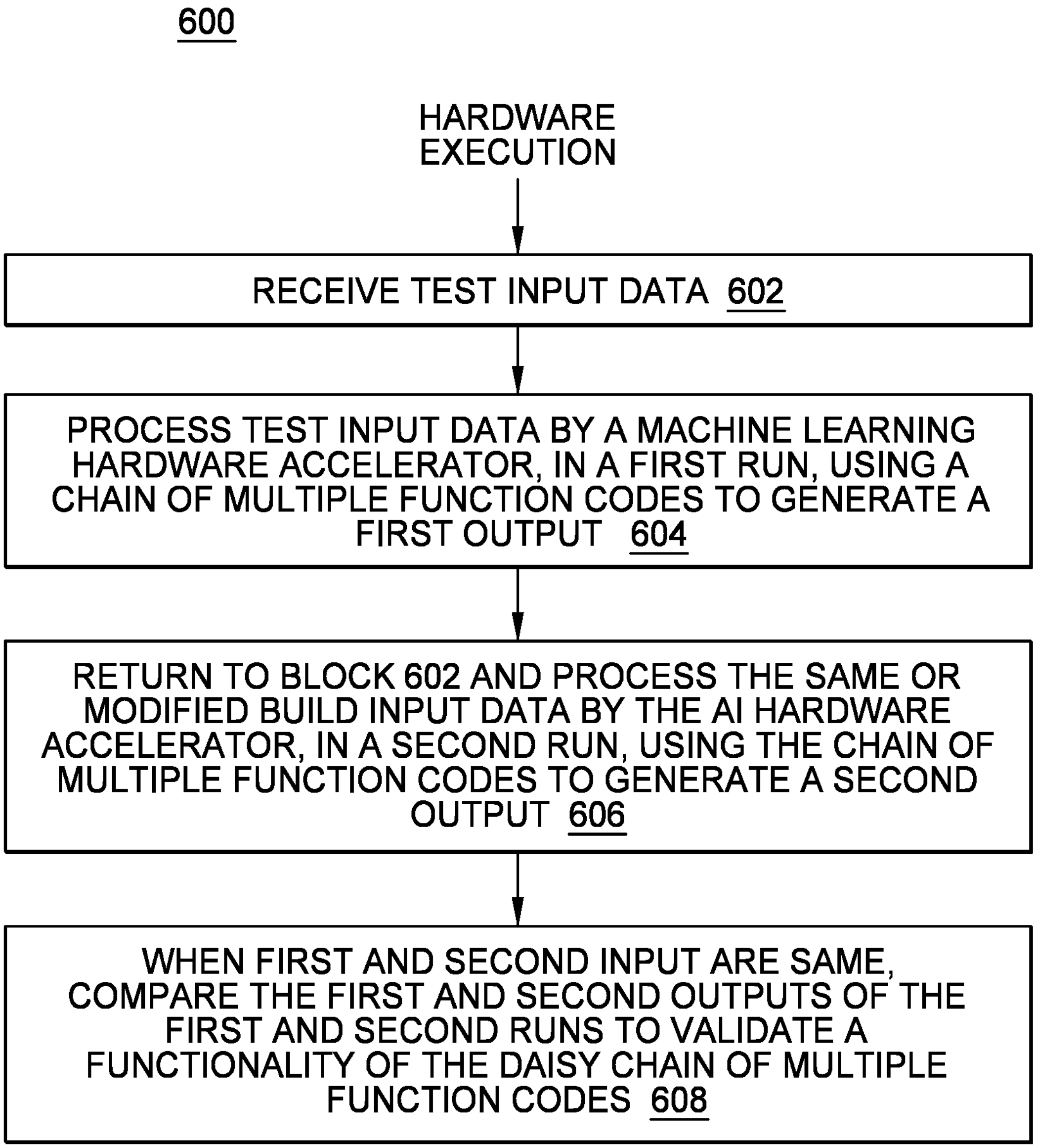
FIG. 6 is a flow chart illustrating example operations of a disclosed method that tests execution consistency of the AI primitives.
Figure 10:
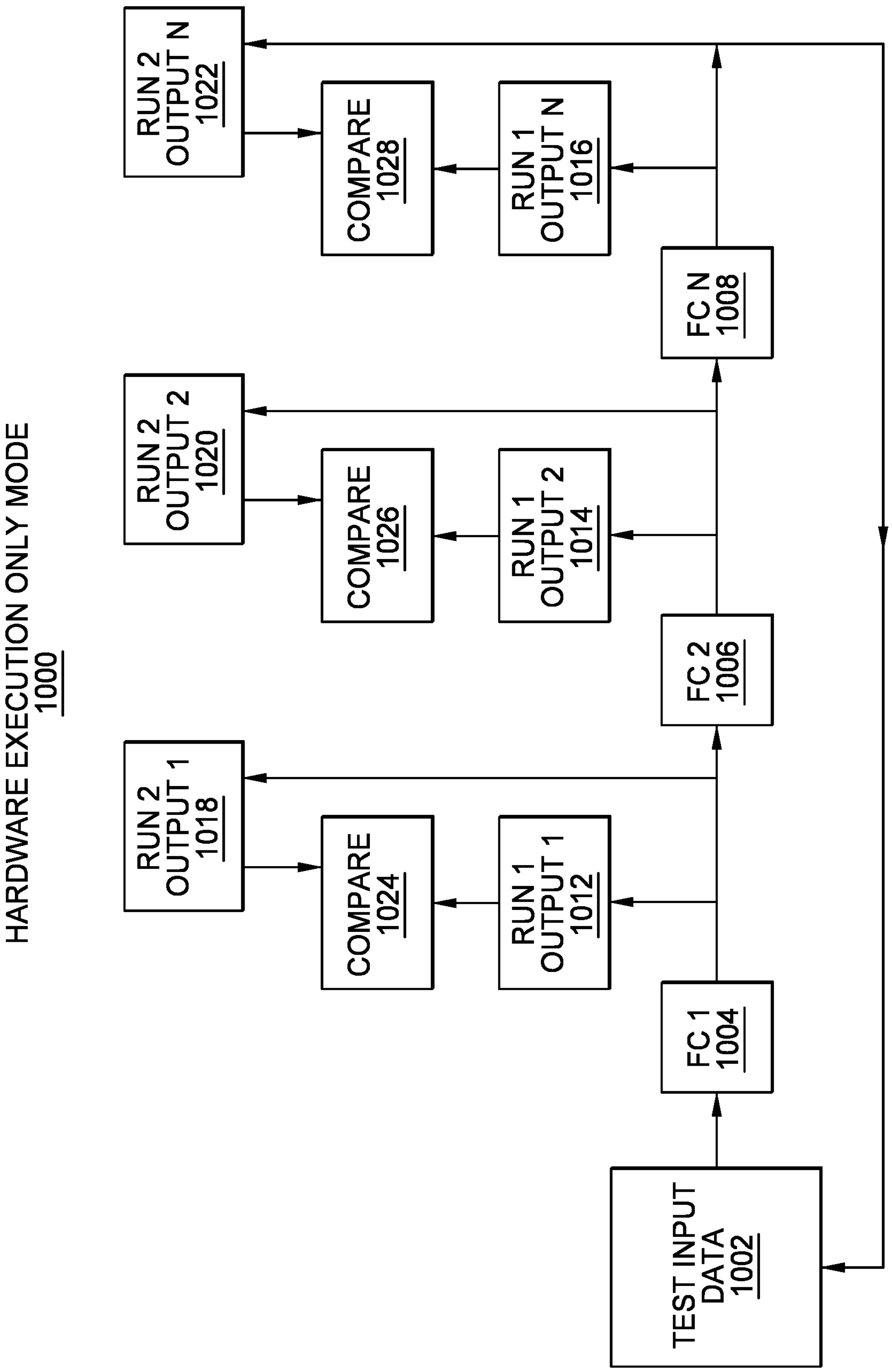
FIG. 10 is a block diagram illustrating an example operational configuration for system level testing of AI primitives for red-light checking and execution consistency testing of one or more disclosed embodiments.

Referring to FIG. 6, example system level testing operations for a method 600 are shown. The non-limiting computer implemented method 600 reduces test execution time for system level testing of AI hardware accelerator 208, while enabling efficient testing performance and effective test coverage. Referring also to FIG. 10, an example system operational configuration 1000 is shown for reducing test execution time for system level testing of AI hardware accelerator 208. The respective operations and system operational components are described in the following as blocks with the reference numbers illustrated for method 600 and system operational components 1000 in FIGS. 6 and 10.

As shown in FIG. 10, system operational configuration 1000 for hardware execution only mode includes a test input data 1002 providing test input data to a chain of AI hardware function codes (FCs) of multiple function codes FC1-FC N 1004, 1006, 1010, three shown. Each of the AI hardware function codes FC 1-FC N 1004, 1006, 1010 provide a separate FC OUTPUT 1 1012, FC OUTPUT 2, 1014, and FC OUTPUT N, 1016 in a first run.

As indicated at blocks 602 and 1002, operations begin with receiving test input data for hardware execution. At block 604 and 1004, the test input data is processed by the AI hardware accelerator 208. In a first run, a daisy chain of multiple hardware function codes FC1, 1004, FC2, 1006, and FC N, 1008 is processed, respectively providing RUN 1 OUTPUT 1, 1012, RUN 1 OUTPUT 2, 1014 and RUN 1 OUTPUT N, 1016 for testing the AI hardware accelerator 208. At blocks 606 and 1008, operations return to block 602, to perform a second run. In the second run, either the same test input data as the first run or a modified test input data is processed by the AI hardware accelerator 208.

Each test input data, i.e., the same test input data and the modified test input data, satisfies predefined test data requirements to provide effective test coverage for system level testing of functionality and behavior of AI hardware primitives 210 of the AI hardware accelerator 208. Using either the same test input data or the modified test input data enables effective system level testing of the functionality of the AI hardware accelerator 208. That is, the generated results or outputs of the first and second runs respectively indicate the same functionality of the AI hardware accelerator 208. Any error identified during execution of the multiple hardware function codes FC1, 1004, FC2, 1006, and FC N, 1008 in either the first or second runs can be located to a specific one of the hardware function codes FC1, FC2, and FC N using the respective generated outputs of the multiple hardware function codes.

The second run respectively provides RUN 2 OUTPUT 1, 1018, RUN 2 OUTPUT 2, 1020 and RUN 2 OUTPUT N, 1022. At block 608, and respective compare blocks 1024, 1026, and 1028, the first outputs and second outputs are compared. That is, RUN 1 OUTPUT 1, 1012 and RUN 2 OUTPUT 1, 1018 are compared based on the same input data. RUN 1 OUTPUT 2, 1014 and RUN 2 OUTPUT 2, 1020, and RUN 1 OUTPUT N. 1016 and RUN 2 OUTPUT N. 1022 are compared. Comparing the outputs of the first and second runs with the same input data enables validating a functionality of the AI hardware accelerator 208. With a mismatch, an error or error condition can be identified. With modified test input data in another run, comparing the outputs of multiple runs at block 608 is not used. However for example, with modified test input data in another run an error or error condition can be identified by a check stop or timeout located to a specific one of the hardware function codes FC1, FC2, and FC N during the run.

Figure 7:
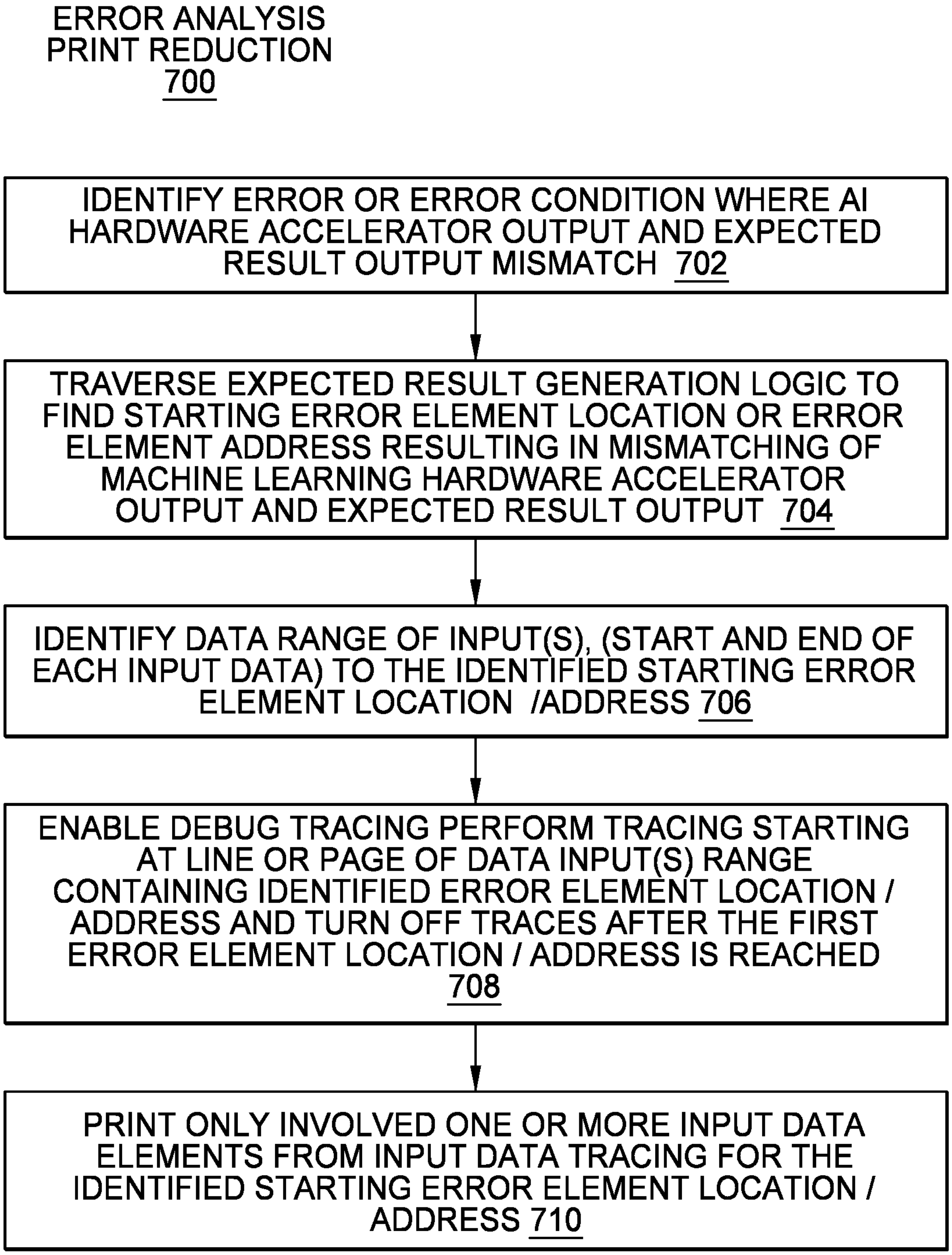
FIG. 7 is a flow chart illustrating example operations of a disclosed method that reduces error printing and error analysis of system level testing of AI primitives.
Figure 11:
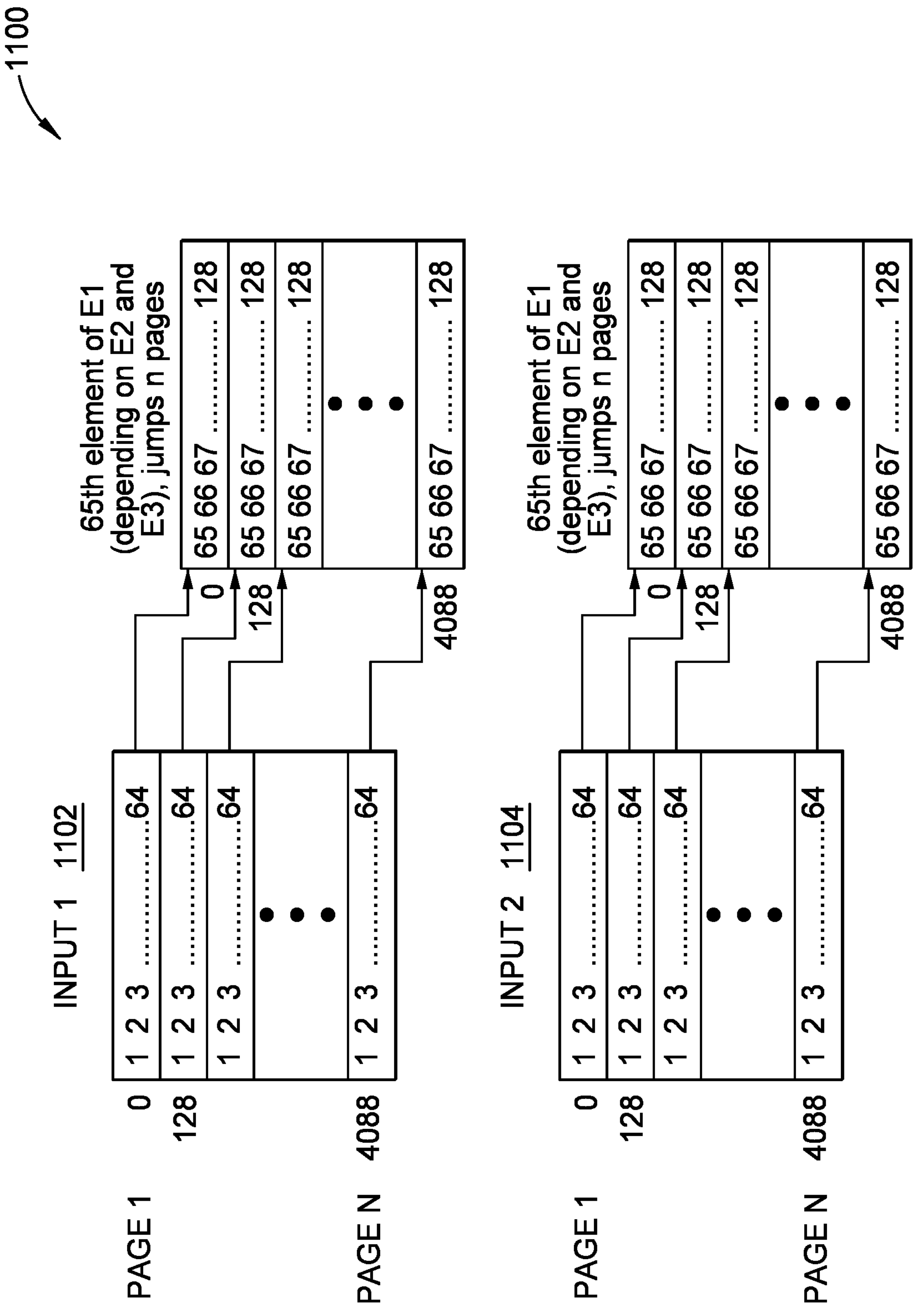
FIG. 11 is a block and data flow diagram illustrating example input data operations for error analysis and error printing of system level testing of AI primitives of one or more disclosed embodiments.

Referring to FIG. 7, there are shown example system level testing operations of a computer-implemented method 700 in accordance with a disclosed embodiment that reduces error analysis and print time for system level testing of AI primitives. Method 700 may be implemented with computer 101 for example, together with system level testing of AI primitives logic 180 and error analysis print process logic 190 to provide computer control for operations performed by method 700. Referring also to FIG. 11, there are shown example data operations 1100 for error analysis and error printing of system level testing of AI primitives.

As indicated at block 702, operations begin with identifying an error or error condition where an output of the AI hardware accelerator 208 and an expected result output of a software AI model mismatch. For example, the error or error condition at block 702 can be identified from results of the compare 816 in FIG. 8, with a mismatch of the first output 808 of the hardware accelerator 208 and the expected result output 814.

As indicated at block 704, an expected result output is traversed for the identified error to find an error data-miscompare element location or error data-miscompare element address resulting in the mismatching outputs of the AI hardware accelerator and the expected result output. As indicated at block 706, a data range of a data input or inputs, i.e., start and end of each data input, to the identified error data-miscompare location or error data-miscompare address is identified. As indicated at block 708, error tracing is performed starting at a line or page of the identified input data range of an identified mismatch element location, such as at the 65 element illustrated in FIG. 11. Traces are turned on to identify the input data resulting in the identified error element location. The print traces are turned off after tracing the first or starting mismatching element of the compared outputs.

Referring to FIG. 11, which shows one data layout used by the AI accelerator, a first data input Input 1, 1102 and a second data input Input 2, 1104 are illustrated, for example with an ADD function code with E1, E2, E3 and E4=65, 65, 1, and 1, respectively. Input 1, 1102 elements, jump n pages (e.g., three pages) after the first 64 elements are read. Mismatch error location is at 65 element of the output and Input 1 range: Input 1 address+three pages for size of one element (two bytes for example), and Input 2 range: Input 2 address+three pages for size of one element (two bytes for example).

As indicated at block 710, error information recording (error printing) is provided only for involved one or more input data elements to the mismatching error location/address for the identified error as indicated at block 710. For example in FIG. 11, two elements are printed for the example Input 1, 1102 elements and Input 2 1104 elements instead of a total input and output buffers which are nine pages.

While the foregoing is directed to embodiments of the present invention, other and further embodiments of the invention may be devised without departing from the basic scope thereof, and the scope thereof is determined by the claims that follow.

What is claimed is:

1. A computer implemented method comprising:

providing test input data;

executing the test input data by an AI hardware accelerator, on a function code in a chain of multiple function codes provided by the AI hardware accelerator, applying an output of the function code to a next function code in the chain, and providing a separate function code output;

executing, for each of the remaining function codes in the chain, a received function code output, applying a function code output to a next function code in the chain, and providing a separate function code output; where a last function code in the chain provides an AI hardware accelerator output;

executing the input data by a software machine learning model, on a simulated function code in a chain of multiple simulated function codes, applying an output of the simulated function code to a next simulated function code in the chain, executing, for each of the remaining simulated function codes in the chain, a received simulated function code output, and applying an output of the simulated function code to a next function code in the chain where a last simulated function code in the chain provides an expected result output; and comparing the AI hardware accelerator output and the expected result output to validate the AI hardware accelerator.

2. The method of claim 1, wherein providing test input data comprises providing valid input data to enable testing of the multiple function codes of the AI hardware accelerator.

3. The method of claim 1, wherein the chain of multiple function codes comprising AI primitives of the AI hardware accelerator, and wherein comparing the AI hardware accelerator output and the expected result output to validate the AI hardware accelerator comprises identifying an error where the AI hardware accelerator output and the expected result output mismatch.

4. The method of claim 1, further comprising identifying an error where the AI hardware accelerator output and the expected result output mismatch.

5. The method of claim 4, wherein identifying an error where the AI hardware accelerator output and the expected result output mismatch comprises identifying a function code output in the chain of multiple function codes for the identified error.

6. The method of claim 4, further comprising traversing an expected result generation logic for the identified error, identifying a starting error data-miscompare element location resulting in the AI hardware accelerator output and the expected result output mismatch, and identifying each data input to the identified starting error data-miscompare element location.

7. The method of claim 6, further comprising identifying a data range of each identified data input to the identified starting error data-miscompare element location, the data range of each identified data input including a start and end of each data input, and enabling debug tracing of each data input.

8. The method of claim 6, further comprising performing debug tracing of each identified data input starting at a page of the identified starting error data-miscompare element location, and ending debug tracing of each data input at the identified starting error data-miscompare element location.

9. The method of claim 8, further comprising providing error information recording by printing involved input data elements from debug tracing of each identified data input to the identified starting error data-miscompare element location.

10. The method of claim 1, wherein executing the test input data only on the function code in a chain of multiple function codes provides requirements of test input data for testing the AI hardware accelerator, without generating multiple different test input data for each of the multiple function codes.

11. A system, comprising:

a processor; and a memory, wherein the memory includes a computer program product to perform operations for testing of Artificial Intelligence (AI) hardware accelerator, the operations comprising:

providing test input data;

executing the test input data by an AI hardware accelerator, on a function code in a chain of multiple function codes provided by the AI hardware accelerator, applying an output of the function code to a next function code in the chain, and providing a separate function code output, executing, for each of the remaining function codes in the chain, a received function code output, applying a function code output to a next function code in the chain, and providing a separate function code output; where a last function code in the chain provides an AI hardware accelerator output;

executing the input data by a software machine learning model, on a simulated function code in a chain of multiple simulated function codes, applying an output of the simulated function code to a next simulated function code in the chain, executing, for each of the remaining simulated function codes in the chain, a received simulated function code output, and applying an output of the simulated function code to a next function code in the chain where a last simulated function code in the chain provides an expected result output; and comparing the AI hardware accelerator output and the expected result output to validate the AI hardware accelerator.

12. The system of claim 11, wherein providing test input data comprises providing valid input data to enable testing of the multiple function codes of the AI hardware accelerator.

13. The system of claim 11, further comprising identifying an error where the AI hardware accelerator output and the expected result output mismatch, traversing an expected result generation logic for the identified error, identifying a starting error data-miscompare element location resulting in the AI hardware accelerator output and the expected result output mismatch.

14. The system of claim 13, further comprising identifying each data input to the identified starting error data-miscompare element location, and performing debug tracing of each identified data input starting at a page of the identified starting error data-miscompare element location.

15. The system of claim 14, further comprising providing error information recording by printing involved input data elements from debug tracing of each identified data input to the identified starting error data-miscompare element location.

16. A computer program product for testing of Artificial Intelligence (AI) hardware accelerator, the computer program product comprising:

a non-transitory computer-readable storage medium having computer-readable program code embodied therewith, the computer-readable program code executable by one or more computer processors to perform an operation comprising:

providing test input data;

executing the test input data by an AI hardware accelerator, on a function code in a chain of multiple function codes provided by the AI hardware accelerator, applying an output of the function code to a next function code in the chain, and providing a separate function code output, executing, for each of the remaining function codes in the chain, a received function code output, applying a function code output to a next function code in the chain, and providing a separate function code output; where a last function code in the chain provides an AI hardware accelerator output;

executing the input data by a software machine learning model, on a simulated function code in a chain of multiple simulated function codes, applying an output of the simulated function code to a next simulated function code in the chain, executing, for each of the remaining simulated function codes in the chain, a received simulated function code output, and applying an output of the simulated function code to a next function code in the chain where a last simulated function code in the chain provides an expected result output; and comparing the AI hardware accelerator output and the expected result output to validate the AI hardware accelerator.

17. The computer program product of claim 16, wherein providing test input data comprises providing valid input data to enable testing of the multiple function codes of the AI hardware accelerator.

18. The computer program product of claim 16, further comprising identifying an error where the AI hardware accelerator output and the expected result output mismatch, traversing an expected result generation logic for the identified error, identifying a starting error data-miscompare element location resulting in the AI hardware accelerator output and the expected result output mismatch.

19. The computer program product of claim 18, further comprising identifying each data input to the identified starting error data-miscompare element location, performing debug tracing of each identified data input starting at a page of the identified starting error data-miscompare element location, and providing error information recording by printing involved input data elements from debug tracing of each identified data input to the mismatching error location.

20. The computer program product of claim 16, wherein executing the test input data on the function code in the chain of multiple function codes provides requirements of test input data for testing the AI hardware accelerator, without generating multiple different test input data for each of the multiple function codes.

* * * * *